US012581814B2

(12) United States Patent
Wang et al.

(10) Patent No.: US 12,581,814 B2
(45) Date of Patent: Mar. 17, 2026

(54) DISPLAY PANEL WITH IMPROVED DISPLAY EFFECT AND MANUFACTURING METHOD THEREOF, AND DISPLAY DEVICE

(71) Applicants:ORDOS YUANSHENG OPTOELECTRONICS CO., LTD., Ordos (CN); BOE TECHNOLOGY GROUP CO., LTD., Beijing (CN)

(72) Inventors: Xu Wang, Beijing (CN); Zihua Li, Beijing (CN); Lu Cai, Beijing (CN); Qiang Guo, Beijing (CN); Wenqiang Jin, Beijing (CN); Chunbo Li, Beijing (CN); Qiang Wang, Beijing (CN); Xudong Wang, Beijing (CN); Ruiqing Zhang, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 707 days.

(21) Appl. No.: 17/996,829

(22) PCT Filed: Oct. 22, 2021

(86) PCT No.: PCT/CN2021/125465
§ 371 (c)(1),
(2) Date: Oct. 21, 2022

(87) PCT Pub. No.: WO2022/160797
PCT Pub. Date: Aug. 4, 2022

(65) Prior Publication Data
US 2023/0209932 A1 Jun. 29, 2023

(30) Foreign Application Priority Data
Jan. 29, 2021 (CN) .......................... 202110128211.3

(51) Int. Cl.
*H01L 29/08* (2006.01)
*H10K 59/12* (2023.01)
(Continued)

(52) U.S. Cl.
CPC ....... *H10K 59/131* (2023.02); *H10K 59/1201* (2023.02); *H10K 59/1213* (2023.02); *H10K 59/1216* (2023.02)

(58) Field of Classification Search
CPC ............. H10K 59/131; H10K 59/1201; H10K 59/1213; H10K 59/1216
(Continued)

(56) References Cited

U.S. PATENT DOCUMENTS

| 2020/0057345 A1* | 2/2020 | Lee | .................... G02F 1/136286 |
| 2020/0105849 A1* | 4/2020 | Kim | .................... H10K 59/1216 |

FOREIGN PATENT DOCUMENTS

| CN | 111613658 A | * | 9/2020 | ........... H10K 59/131 |
| KR | 20180003307 A | * | 1/2018 | |
| KR | 20190122073 A | * | 10/2019 | |

* cited by examiner

*Primary Examiner* — Phuc T Dang
(74) *Attorney, Agent, or Firm* — DINSMORE & SHOHL LLP

(57) ABSTRACT

Provided are a display panel and a manufacturing method thereof, and a display device. The display panel includes a base substrate and a plurality of sub-pixels. At least one sub-pixel includes a light-emitting element; a first transistor; a capacitor including a first electrode and a second electrode plate; a second transistor including a second active layer including a third and a fourth electrode area, and a second channel area; and a third transistor including a third active layer, and a third gate electrode connected to a reset line, the third active layer including a fifth electrode area, a sixth electrode area directly connected to an initialization line via a via hole, and a third channel area. An orthographic (Continued)

projection of the initialization line on the base substrate is located between orthographic projections of the reset line and the gate line on the base substrate.

20 Claims, 6 Drawing Sheets

(51) Int. Cl.
    *H10K 59/121*        (2023.01)
    *H10K 59/131*        (2023.01)
(58) Field of Classification Search
    USPC ........................................................... 257/40
    See application file for complete search history.

Vinit

C2

Data     VDD

CT1

M

DISPLAY PANEL WITH IMPROVED DISPLAY EFFECT AND MANUFACTURING METHOD THEREOF, AND DISPLAY DEVICE

CROSS-REFERENCE TO RELATED APPLICATIONS

The present application is a U.S. National Stage Application under 35 U.S.C. § 371 of International Patent Application No. PCT/CN2021/125465, filed on Oct. 22, 2021, which claims priority to China Patent Application No. 202110128211.3 filed on Jan. 29, 2021, the disclosures of both of which are incorporated by reference herein in their entirety.

TECHNICAL FIELD

The present disclosure relates to a display panel and a manufacturing method thereof, and a display device.

BACKGROUND

With the development of display technology, the subpixels of the display panel comprise more transistors and signal lines. Moreover, there are more and more connecting members between the transistors and the signal lines.

SUMMARY

According to one aspect of the embodiments of the present disclosure, a display panel is provided. The display panel comprises: a base substrate and a plurality of sub-pixels located on the base substrate. At least one sub-pixel of the plurality of sub-pixels comprising: a light-emitting element, comprising an anode and a cathode; a first transistor comprising a first active layer and a first gate which is connected to a gate line, wherein the first active layer comprises a first electrode area, a second electrode area, and a first channel area located between the first electrode area and the second electrode area, the first electrode area is connected to a data line, and the second electrode area is connected to a power line; a capacitor comprising a first electrode plate and a second electrode plate connected to the power line; a second transistor comprising a second active layer and a second gate which is connected to the first electrode plate, wherein the second active layer comprises a third electrode area, a fourth electrode area, and a second channel area located between the third electrode area and the fourth electrode area, the third electrode area is connected to the second electrode area, and the fourth electrode area is connected to the anode; and a third transistor comprising a third active layer and a third gate which is connected to a reset line, wherein the third active layer comprises a fifth electrode area, a sixth electrode area, and a third channel area located between the fifth electrode area and the sixth electrode area, the fifth electrode area is connected to the first electrode plate, and the sixth electrode area is directly connected to an initialization line through a via hole, wherein an orthographic projection of the initialization line on the base substrate is located between an orthographic projection of the reset line on the base substrate and an orthographic projection of the gate line on the base substrate.

In some embodiments, an orthographic projection of the via hole on the base substrate is located within the orthographic projection of the initialization line on the base substrate.

In some embodiments, the orthographic projection of the via hole on the base substrate is located within the orthographic projection of the sixth electrode area on the base substrate.

In some embodiments, the fifth electrode area comprises a first portion, a second portion, and a third portion connected between the first portion and the second portion; the third active layer further comprises another sixth electrode area, and another third channel area located between the second portion and the another sixth electrode area; and the third gate comprises two gates, wherein one of the two gates is located between the first portion and the sixth electrode area, and the other of the two gates is located between the second portion and the another sixth electrode area.

In some embodiments, the sixth electrode area comprises: a fourth portion; and a fifth portion connected to the fourth portion, located on one side of the fourth portion away from the third channel area, and located on one side of the fourth portion away from the another sixth electrode area, wherein: an orthographic projection of the via hole on the base substrate is located within an orthographic projection of the fifth portion on the base substrate, and the orthographic projection of the fifth portion on the base substrate is located within the orthographic projection of the initialization line on the base substrate.

In some embodiments, an extending direction of the fifth portion is perpendicular to an extending direction of the fourth portion.

In some embodiments, an orthographic projection of an end of the fifth portion away from the fourth portion on the base substrate has a radian.

In some embodiments, an orthographic projection of the third portion on the base substrate is located within an orthographic projection of the power line on the base substrate.

In some embodiments, the at least one sub-pixel further comprises: a fourth transistor comprising a fourth active layer and a fourth gate which is connected to the gate line, wherein the fourth active layer comprises a seventh electrode area, an eighth electrode area, and a fourth channel area located between the seventh electrode area and the eighth electrode area, the seventh electrode area is connected to the second gate, and the eighth electrode area is connected to the fourth electrode area.

In some embodiments, the at least one sub-pixel further comprises: a fifth transistor comprising a fifth active layer and a fifth gate which is connected to a control line, wherein the fifth active layer comprises a ninth electrode area, a tenth electrode area, and a fifth channel area located between the ninth electrode area and the tenth electrode area, the ninth electrode area is connected to the power line, and the tenth electrode area is connected to the second electrode area; and a sixth transistor comprising a sixth active layer and a sixth gate which is connected to the control line, wherein the sixth active layer comprises an eleventh electrode area, a twelfth electrode area, and a sixth channel area located between the eleventh electrode area and the twelfth electrode area, the eleventh electrode area is connected to the fourth electrode area, and the twelfth electrode area is connected to the anode.

In some embodiments, the at least one sub-pixel further comprises: a seventh transistor comprising a seventh active layer and a seventh gate which is connected to another reset line, wherein the seventh active layer comprises a thirteenth electrode area, a fourteenth electrode area, and a seventh channel area located between the thirteenth electrode area and the fourteenth electrode area, the thirteenth electrode area is connected to the twelfth electrode area, and the fourteenth electrode area is connected to another initialization line.

In some embodiments, each of the plurality of sub-pixels comprises the first transistor, the second transistor, the third transistor, the fourth transistor, the fifth transistor, the sixth transistor, and the seventh transistor.

In some embodiments, the first active layer, the second active layer, the third active layer, the fourth active layer, the fifth active layer, the sixth active layer and the seventh active layer are located in a same layer.

In some embodiments, each of the first transistor, the second transistor, the third transistor, the fourth transistor, the fifth transistor, the sixth transistor and the seventh transistor is a P-type transistor.

In some embodiments, the second electrode plate and the initialization line are located in a same layer.

In some embodiments, the gate line, the first electrode plate and the reset line are located in a same layer.

In some embodiments, the data line and the power line are located in a same layer.

In some embodiments, the gate line and the first gate are integrally provided; the first electrode plate and the second gate are integrally provided; and the reset line and the third gate are integrally provided.

According to another aspect of the embodiments of the present disclosure, provided is a display device, comprising the display panel according to any one of the above embodiments.

According to still another aspect of the embodiments of the present disclosure, provided is a manufacturing method of a display panel, comprising: providing a base substrate and forming a plurality of sub-pixels on the base substrate. At least one sub-pixel of the plurality of sub-pixels comprising: a light-emitting element, comprising an anode and a cathode; a first transistor comprising a first active layer and a first gate which is connected to a gate line, wherein the first active layer comprises a first electrode area, a second electrode area, and a first channel area located between the first electrode area and the second electrode area, the first electrode area is connected to a data line, and the second electrode area is connected to a power line; a capacitor comprising a first electrode plate and a second electrode plate connected to the power line; a second transistor comprising a second active layer and a second gate which is connected to the first electrode plate, wherein the second active layer comprises a third electrode area, a fourth electrode area, and a second channel area located between the third electrode area and the fourth electrode area, the third electrode area is connected to the second electrode area, and the fourth electrode area is connected to the anode; and a third transistor comprising a third active layer and a third gate which is connected to a reset line, wherein the third active layer comprises a fifth electrode area, a sixth electrode area, and a third channel area located between the fifth electrode area and the sixth electrode area, the fifth electrode area is connected to the first electrode plate, and the sixth electrode area is directly connected to an initialization line through a via hole, wherein an orthographic projection of the initialization line on the base substrate is located between an orthographic projection of the reset line on the base substrate and an orthographic projection of the gate line on the base substrate.

Other features, aspects and advantages of the present disclosure will become apparent from the following detailed description of exemplary embodiments of the present disclosure with reference to the accompanying drawings.

BRIEF DESCRIPTION OF THE ACCOMPANYING DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
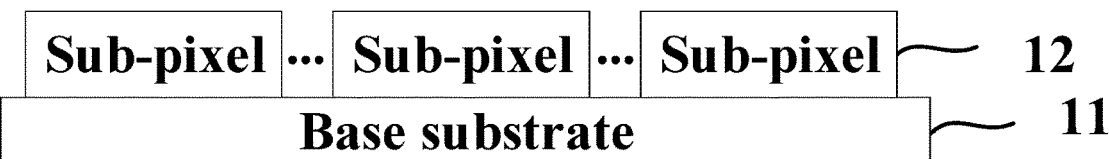
FIG. 1 is a schematic structural view showing a display panel according to an embodiment of the present disclosure.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity, or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that, in the related art, in the sub-pixel of the display panel, the transistor connected to an initialization line is required to be connected to the initialization line through an additional connecting member. On one hand, there may be mutual interference between the additional connecting member and other signal lines, which affects the display effect of the display panel. On the other hand, during the process of manufacturing the additional connecting member, the residues may also adversely affect the display effect of the display panel.

In view of this, the embodiments of the present disclosure provide the following technical solution.

FIG. 1 is a schematic structural view showing a display panel according to an embodiment of the present disclosure.

As shown in FIG. 1, the display panel comprises a base substrate 11 and a plurality of sub-pixels 12 located on the base substrate 11. At least one sub-pixel 12 of the plurality of sub-pixels 12 in the display panel may comprise the structure shown in FIG. 2.

Figure 2:
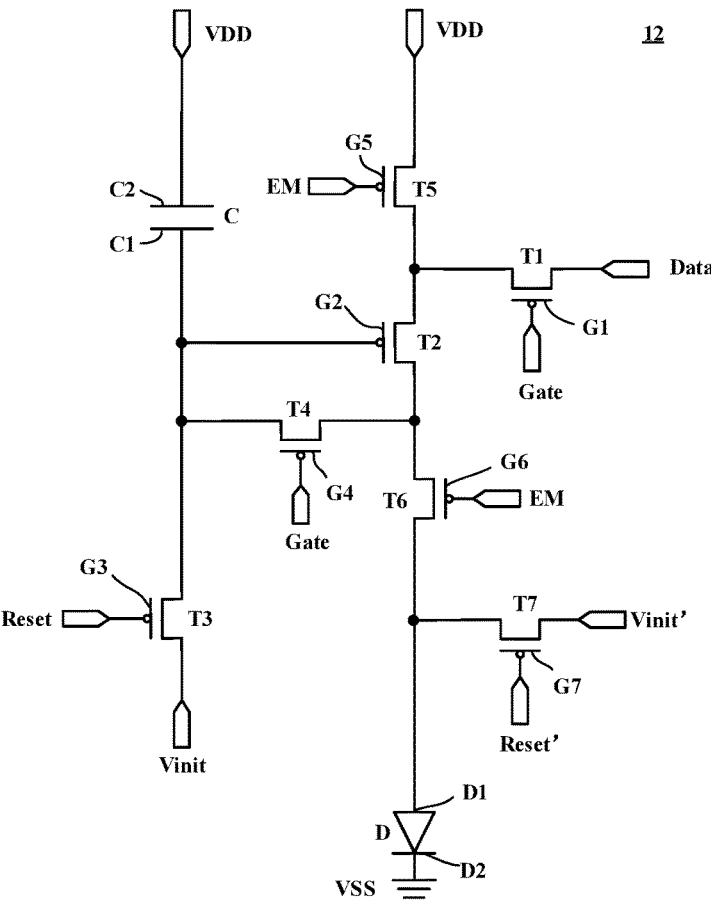
FIG. 2 is a schematic structural view showing a sub-pixel according to an embodiment of the present disclosure.
Figure 7A:
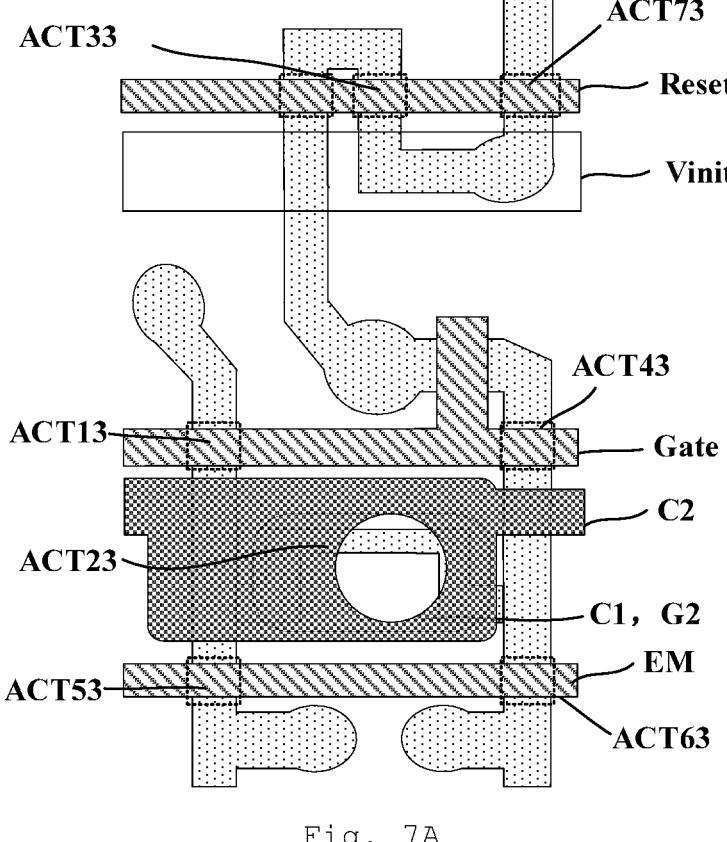
FIG. 7A is a schematic view showing a stacking layout of layers shown in FIGS. 3 to 5 in a sub-pixel according to an embodiment of the present disclosure.
Figure 7B:
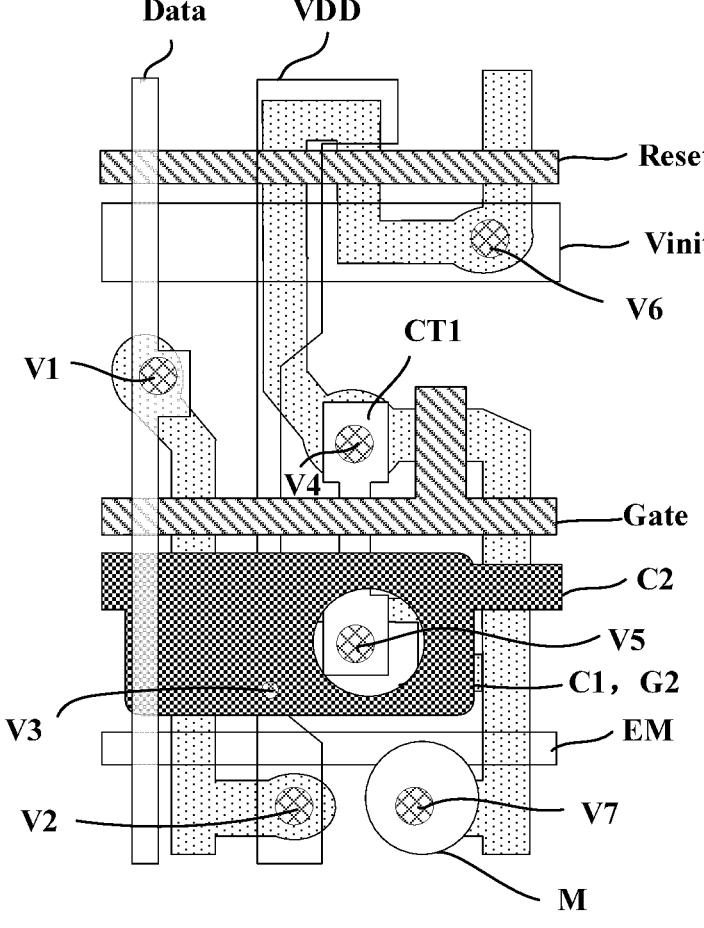
FIG. 7B is a schematic view showing a stacking layout of layers shown in FIGS. 3 to 6 in a sub-pixel according to an embodiment of the present disclosure.

FIG. 2 is a schematic structural view showing a sub-pixel according to an embodiment of the present disclosure. FIGS. 3 to 6 are schematic views showing a layout of a certain layer in a sub-pixel according to some embodiments of the present disclosure respectively. FIG. 7A is a schematic view showing a stacking layout of layers shown in FIGS. 3 to 5 in a sub-pixel according to an embodiment of the present disclosure. FIG. 7B is a schematic view showing a stacking layout of layers shown in FIGS. 3 to 6 in a sub-pixel according to an embodiment of the present disclosure.

It should be noted that, in the present disclosure, each layer shown in different schematic layout views may also be understood as the orthographic projection of each layer on the base substrate 11.

As shown in FIG. 2, the sub-pixel 12 may comprise a light-emitting element D, a first transistor T1, a capacitor C, a second transistor T2 and a third transistor T3. The light-emitting element D comprises an anode D1 and a cathode D2. In some implementations, the light-emitting element D may be an organic light-emitting diode (OLED). Here, the first transistor T1 may also be referred to as a switching transistor, the second transistor T2 may also be referred to as a driving transistor, and the third transistor T3 may also be referred to as a reset transistor.

The first transistor T1 is configured to transmit the data signal from the data line Data to the second transistor T2 in a case of being turned on, in response to a scan signal of a gate line Gate. The second transistor T2 is configured to transmit the driving current Id to the light-emitting element D to drive the light-emitting element D to emit light in a case of being turned on. The third transistor T3 is configured to reset the voltage of the gate G2 of the second transistor T2 to the voltage of the initialization line Vinit in a case of being turned on, in response to the reset signal of the reset line Reset.

In one or more embodiments, referring to FIG. 2, the sub-pixel 12 may further comprise one or more of a fourth transistor T4, a fifth transistor T5, a sixth transistor T6, and a seventh transistor T7. Here, the fourth transistor T4 may also be referred to as a compensation transistor, the fifth transistor T5 may also be referred to as a driving control transistor, the sixth transistor T6 may also be referred to as a light emission control transistor, and the seventh transistor T7 may also be referred to as a bypass transistor. For example, the fourth transistor T4 is configured to make the second transistor T2 in a diode-connected state in a case of being turned on, in response to the scan signal of the gate line Gate. For example, the fifth transistor T5 and the sixth transistor T6 are configured to be turned on in response to the control signal of the control line EM such that emission current Id flows to the light-emitting element D. For example, the seventh transistor T7 is configured to allow a part of the driving current Id to flow as bypass current Ibp in a case of being turned on in response to the reset signal of another reset line Reset'.

In some embodiments, the first transistor T1, the second transistor T2, the third transistor T3, the fourth transistor T4, the fifth transistor T5, the sixth transistor T6 and the seventh transistor T7 are all P-type transistors. In other embodiments, one or more of the first transistor T1, the second transistor T2, the third transistor T3, the fourth transistor T4, the fifth transistor T5, the sixth transistor T6 and the seventh transistor T7 may be N type thin film transistors.

Figure 3:
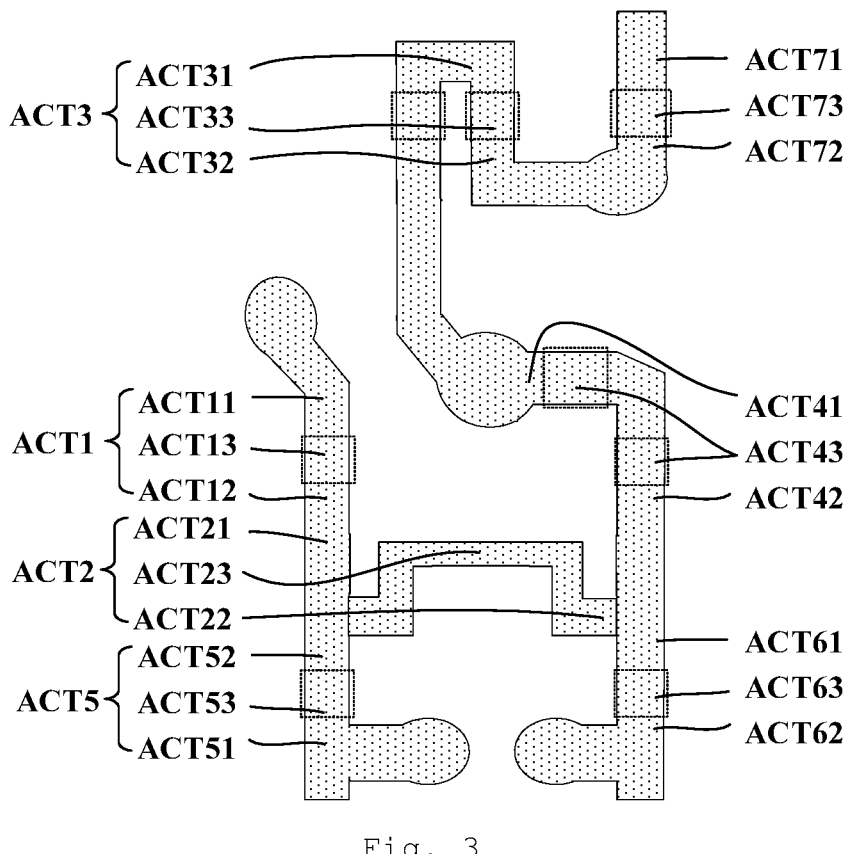
FIGS. 3 to 6 are schematic views showing a layout of a certain layer in a sub-pixel according to some embodiments of the present disclosure respectively.
Figure 4:
Figure 4:
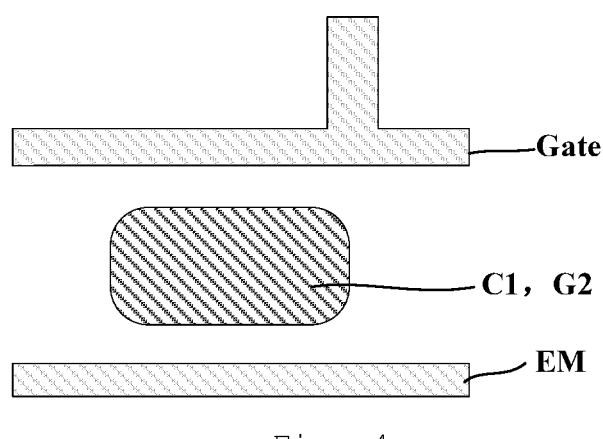
Figure 5:
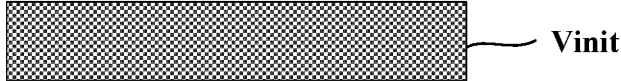
Figure 5:
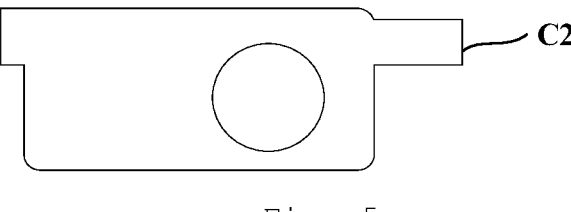
Figure 6:
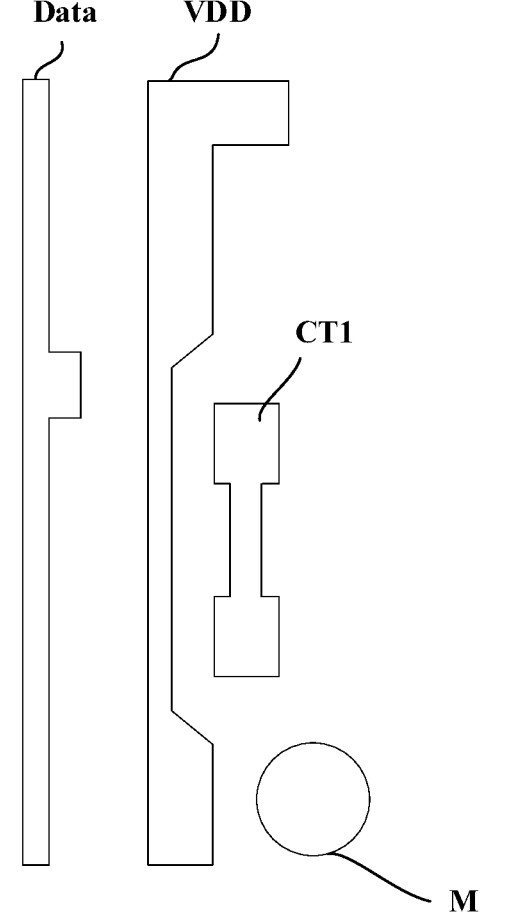

For example, the active layer of each of the first transistor T1, the second transistor T2, the third transistor T3, the fourth transistor T4, the fifth transistor T5, the sixth transistor T6 and the seventh transistor T7 may be as shown in FIG. 3. The material of the active layer may comprise polysilicon, for example low-temperature polysilicon or the like. The active layer of each transistor comprises two electrode areas and a channel area located between the two electrode areas. It should be understood that, one of the two electrode areas is a source area, and the other is a drain area. It should also be understood that the doping concentration of the two electrode areas is greater than the doping concentration of the channel area. In other words, each of the two electrode areas is a conductor area, while the channel area is a semiconductor area.

Referring to FIGS. 2 and 3, the first transistor T1 comprises a first active layer ACT1 and a first gate G1 connected to the gate line Gate. In some embodiments, the gate line Gate and the first gate G1 may be integrally provided. As shown in FIG. 3, the first active layer ACT1 comprises a first electrode area ACT11, a second electrode area ACT12, and a first channel area ACT13 located between the first electrode area ACT11 and the second electrode area ACT12. The first channel area ACT13 is an area where the first active layer ACT1 overlaps with the gate line Gate. Here, the first electrode area ACT11 is connected to the data line Data, and the second electrode area ACT12 is connected to the power line VDD. For example, the first electrode area ACT11 may be connected to the data line Data through the via hole V1 shown in FIG. 7B. In some embodiments, the second electrode area ACT12 may be connected to the power line VDD through the fifth active layer ACT5 of the fifth transistor T5. For example, the fifth active layer ACT5 may be connected to the power line VDD through the via hole V2 shown in FIG. 7B. In some embodiments, referring to FIG. 6, the data line Data and the power line VDD may be located in a same layer.

It should be noted that, in the present disclosure, two members located in a same layer means that the two members are formed by patterning a same material layer.

The capacitor C comprises a first electrode plate C1 and a second electrode plate C2 connected to the power line VDD. For example, the second electrode plate C2 may be connected to the power line VDD through the via hole V3 shown in FIG. 7B.

The second transistor T2 comprises a second active layer ACT2 and a second gate G2 connected to the first electrode plate C1. In some embodiments, the first electrode plate C1 and the second gate G2 may be integrally provided. As shown in FIG. 3, the second active layer ACT2 comprises a third electrode area ACT21, a fourth electrode area ACT22, and a second channel area ACT23 located between the third electrode area ACT21 and the fourth electrode area ACT22. Referring to FIGS. 3 and 7A, the second channel area ACT23 is an area where the second active layer ACT2 overlaps with the first electrode plate C1. The third electrode area ACT21 is connected to the second electrode area ACT12, and the fourth electrode area ACT22 is connected to the anode D1. In some embodiments, the third electrode area ACT21 and the second electrode area ACT12 may be integrally provided. In some embodiments, the third electrode area ACT21 may be connected to the power line VDD through the fifth active layer ACT5 of the fifth transistor T5.

The third transistor T3 comprises a third active layer ACT3 and a third gate G3 connected to the reset line Reset. In some embodiments, the reset line Reset and the third gate G3 may be integrally provided. As shown in FIG. 3, the third active layer ACT3 comprises a fifth electrode area ACT31, a sixth electrode area ACT32, and a third channel area ACT33 located between the fifth electrode area ACT31 and the sixth electrode area ACT32. Referring to FIGS. 3 and 7A, the third channel area ACT33 is an area where the third active layer ACT3 overlaps with the reset line Reset.

The fifth electrode area ACT31 is connected to the first electrode plate C1. For example, the fifth electrode area ACT31 may be connected to the connecting member CT through the via hole V4 shown in FIG. 7B, and the first electrode plate C1 may be connected to the connecting member CT through the via hole V5 shown in FIG. 7B. The sixth electrode area ACT32 is directly connected to the initialization line Vinit through the via hole V6. In some embodiments, referring to FIG. 4, the gate line Gate, the first electrode plate C1 and the reset line Reset may be located in a same layer. In some embodiments, referring to FIG. 5, the second electrode plate C2 and the initialization line Vinit may be located in a same layer. In some embodiments, referring to FIG. 6, the connecting member CT, the data line Data and the power line VDD may be located in a same layer.

Referring to FIG. 7B, the orthographic projection of the initialization line Vinit on the base substrate 11 is located between the orthographic projection of the reset line Reset on the base substrate and the orthographic projection of the gate line Gate on the base substrate 11.

In the above embodiments, the initialization line Vinit is located between the reset line Reset and the gate line Gate, and the sixth electrode area ACT32 of the third transistor T3 is directly connected to the initialization line Vinit through the via hole V6. In such a display panel, the sixth electrode area ACT32 is connected to the initialization line Vinit without an additional connecting member, which reduces the parasitic capacitance caused by the additional connecting member and improves the display effect of the display panel.

In addition, since an additional connecting member is not required, the adverse influence of the residues of the additional connecting member on the display effect of the display panel during the manufacturing process is avoided.

Figure 8:
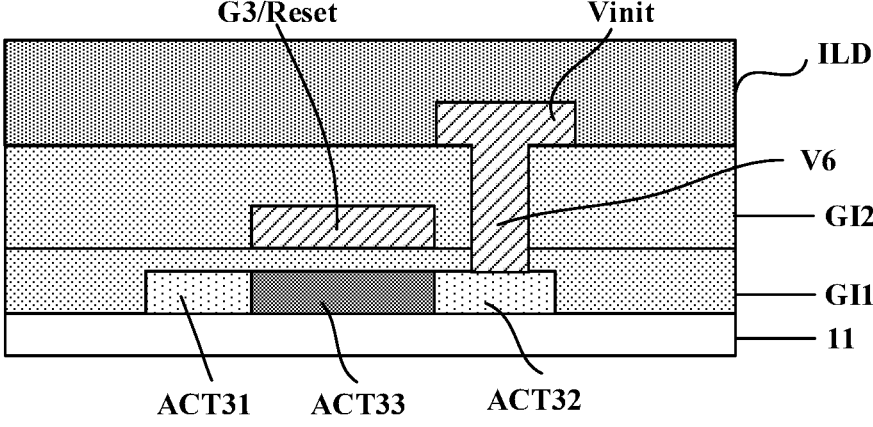
FIG. 8 is a schematic cross-sectional view showing connection of a sixth electrode area of a third transistor and an initialization line according to an embodiment of the present disclosure.

FIG. 8 is a schematic cross-sectional view showing connection of a sixth electrode area of a third transistor and an initialization line according to an embodiment of the present disclosure.

In some embodiments, as shown in FIG. 8, the first insulating layer GI1 is located on one side of the third active layer ACT3 away from the base substrate 11, the third gate G3 is located on one side of the first insulating layer GI1 away from the base substrate 11, and the second insulating layer GI2 is located on one side of the third gate G3 and the first insulating layer GI1 away from the base substrate 11.

The initialization line Vinit is located on one side of the second insulating layer GI2 away from the base substrate 11, and directly connected to the sixth electrode area ACT32 of the third transistor T3 through the via hole V6 penetrating through the second insulating layer GI2 and the first insulating layer GI1.

The interlayer insulating layer ILD is located on one side of the initialization line Vinit and the second insulating layer GI2 away from the base substrate 11. It can be understood that, one of the source and the drain of the third transistor T3 may be connected to one of the fifth electrode area ACT31 and the sixth electrode area ACT32 through one via hole penetrating through the interlayer insulating layer ILD, and the other one of the source and drain of the third transistor T3 may be connected to the other one of the fifth electrode area ACT31 and the sixth electrode area ACT32 through another via hole penetrating through the interlayer insulating layer ILD.

In a case where the sixth electrode area ACT32 is directly connected to the initialization line Vinit through the via hole V6, referring to FIG. 7B, the orthographic projection of the via hole V6 on the base substrate 11 at least partially overlaps with the orthographic projection of the initialization line Vinit on the base substrate 11.

In some embodiments, referring to FIGS. 7B and 8, the orthographic projection of the via hole V6 on the base substrate 11 is located within the orthographic projection of the initialization line Vinit on the base substrate 11. In this way, it is ensured that, the initialization line Vinit can be connected to the sixth electrode area ACT32 through the via hole V6.

In some embodiments, referring to FIGS. 7B and 8, the orthographic projection of the via hole V6 on the base substrate 11 is located within the orthographic projection of the sixth electrode area ACT32 on the base substrate 11. In this way, it is ensured that, the sixth electrode area ACT32 can be connected to the initialization line Vinit through the via hole V6.

Figure 9:
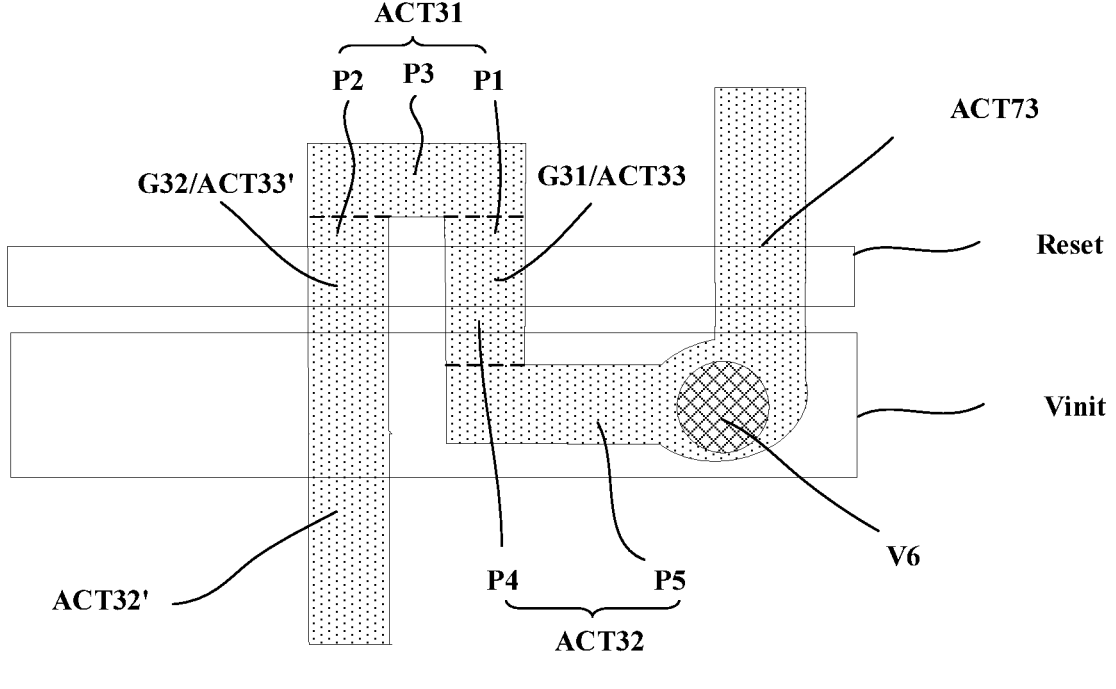
FIG. 9 is a partially enlarged schematic view showing FIG. 7B according to an embodiment of the present disclosure.

FIG. 9 is a partially enlarged schematic view showing FIG. 7B according to an embodiment of the present disclosure. It should be noted that, for the sake of more clarity, FIG. 9 only shows some layers of the sub-pixel, with certain layers omitted.

In some embodiments, the fifth electrode area ACTT of the third transistor T3 comprises a first portion P1, a second portion P2, and a third portion P3 connected between the first portion P1 and the second portion P2. For example, the extending direction of the third portion P3 is different from the extending direction of the first portion P1, and different from the extending direction of the second portion P2.

The third active layer ACT3 further comprises another sixth electrode area ACT32', and another third channel area ACT33' between the second portion P2 and the another sixth electrode area ACT32'. The third gate G3 comprises two gates G31 and G32, one gate G31 of the two gates is located between the first portion P1 and the sixth electrode area ACT32, and the other gate G32 of the two gates is located between the second portion P2 and the another sixth electrode area ACT32'.

In some embodiments, the sixth electrode area ACT32 comprises a fourth portion P4 and a fifth portion P5 connected to the fourth portion P4. The fifth portion P5 is located on one side of the fourth portion P4 away from the third channel area ACT33, and located on one side of the fourth portion P4 away from the another sixth electrode area ACT32'. The orthographic projection of the via hole V6 on the base substrate 11 is located within the orthographic projection of the fifth portion P5 on the base substrate 11. The orthographic projection of the fifth portion P5 on the base substrate 11 is located within the orthographic projection of the initialization line Vinit on the base substrate 11.

In some embodiments, the extending direction of the fifth portion P5 is perpendicular to the extending direction of the fourth portion P4. For example, the extending direction of the fifth portion P5 is the same as the extending direction of the initialization line Vinit, and the extending direction of the fourth portion P4 is the same as the extending direction of the power line VDD. In this way, it is favorable for reducing the length of the third active layer and reducing the mutual influence between the third active layer and other active layers.

In some embodiments, the orthographic projection of the end of the fifth portion P5 away from the fourth portion P4 on the base substrate 11 has a radian. In this way, a contact area is enlarged, and thus the via hole V6 is connected to the fifth portion P5 more reliably.

In some embodiments, the orthographic projection of the third portion P3 on the base substrate 11 is located within the orthographic projection of the power line VDD on the base substrate 11. In this way, a capacitor is formed between the third portion P3 and the power line VDD, which is favorable for reducing the mutual influence between the third portion P3 and other signal lines, thereby lowering the crosstalk of the display panel.

In some embodiments, the display panel may further comprise a metal layer connected to the power line VDD. For example, the metal layer is located in a same layer as the initialization line Vinit. The orthographic projection of the metal layer on the base substrate 11 overlaps with the orthographic projection of the first electrode area ACT11 on the base substrate 11, and overlaps with the orthographic projection of the fifth electrode area ACT11 on the base substrate 11. In this way, the mutual interference between the first electrode area ACT11 and the fifth electrode area ACT31 is reduced, thereby further lowering the crosstalk of the display panel, and improving the display effect.

As described above, in the plurality of sub-pixels of the display panel according to the embodiments of the present disclosure, at least one sub-pixel 12 may further comprise one or more of the fourth transistor T4, the fifth transistor T5, the sixth transistor T6 and the seventh transistor T7.

The fourth transistor T4, the fifth transistor T5, the sixth transistor T6 and the seventh transistor T7 will be described below in conjunction with FIGS. 2 and 3.

The fourth transistor T4 comprises a fourth active layer ACT4 and a fourth gate G4 connected to the gate line Gate. In some embodiments, the gate line Gate and the fourth gate G4 may be integrally provided. As shown in FIG. 3, the fourth active layer ACT4 comprises a seventh electrode area ACT41, an eighth electrode area ACT42, and a fourth channel area ACT43 located between the seventh electrode area ACT41 and the eighth electrode area ACT42. The seventh electrode area ACT41 is connected to the second gate G2, and the eighth electrode area ACT42 is connected to the fourth electrode area ACT22. For example, the seventh electrode area ACT41 may be connected to the connecting member CT1 through the via hole V4 shown in FIG. 7B, and the second gate G2 may be connected to the connecting member CT1 through the via hole V5 shown in FIG. 7B. In some embodiments, the seventh electrode area ACT41 and the fifth electrode area ACT31 may be integrally provided. In some embodiments, the eighth electrode area ACT42 and the fourth electrode area ACT22 may be integrally provided. In some embodiments, the fourth channel area ACT43 may comprise two portions spaced apart, that is, the fourth gate G4 may comprise two gates.

The fifth transistor T5 comprises a fifth active layer ACT5 and a fifth gate G5 connected to the control line EM. As shown in FIG. 3, the fifth active layer ACT5 comprises a ninth electrode area ACT51, a tenth electrode area ACT52, and a fifth channel area ACT53 located between the ninth electrode area ACT51 and the tenth electrode area ACT52. The ninth electrode area ACT51 is connected to the power line VDD, and the tenth electrode area ACT52 is connected to the second electrode area ACT12. For example, the ninth electrode area ACT51 may be connected to the power line VDD through the via hole V2 shown in FIG. 7B. For example, the tenth electrode area ACT52 may be connected to the second electrode area ACT12 through the third electrode area ACT21. In some embodiments, referring to FIG. 4, the control line EM, the gate line Gate, the first electrode plate C1 and the reset line Reset may be located in a same layer.

The sixth transistor T6 comprises a sixth active layer ACT6 and a sixth gate G6 connected to the control line EM. As shown in FIG. 3, the sixth active layer ACT6 comprises an eleventh electrode area ACT61, a twelfth electrode area ACT62, and a sixth channel area ACT63 located between the eleventh electrode area ACT61 and the twelfth electrode area ACT62. The eleventh electrode area ACT61 is connected to the fourth electrode area ACT22, and the twelfth electrode area ACT62 is connected to the anode D1. In some embodiments, the eleventh electrode area ACT61 and the fourth electrode area ACT22 may be integrally provided. In some embodiments, the twelfth electrode area ACT62 may be connected to the conductive layer M (for example, a metal layer) through the via hole V7 shown in FIG. 7B, and the conductive layer M may be connected to the anode D1 through other via hole(s). In some embodiments, referring to FIG. 6, the conductive layer M, the connecting member CT, the data line Data and the power line VDD may be located in a same layer.

The seventh transistor T7 comprises a seventh active layer ACT7 and a seventh gate G7 connected to the reset line Reset. In some embodiments, the reset line Reset and the seventh gate G7 may be integrally provided. As shown in FIG. 3, the seventh active layer ACT7 comprises a thirteenth electrode area ACT71, a fourteenth electrode area ACT72, and a seventh channel area ACT73 located between the thirteenth electrode area ACT71 and the fourteenth electrode area ACT72. The thirteenth electrode area ACT71 is connected to the twelfth electrode area ACT62, and the fourteenth electrode area ACT72 is connected to another initialization line Vinit'. For example, the fourteenth electrode area ACT72 may be directly connected to the another initialization line Vinit' through a via hole similar to the via hole V6 shown in FIG. 7B. In some embodiments, the fourteenth electrode area ACT72 and the sixth electrode area ACT32 may be integrally provided.

It can be understood that, the seventh active layer ACT7 shown in FIG. 3 is the seventh active layer ACT7 of the seventh transistor T7 of another sub-pixel.

Referring to FIGS. 3 and 7A, the fifth channel area ACT53 may be an area where the fifth active layer ACT5 overlaps with the control line EM, and the sixth channel area ACT63 may be an area where the sixth active layer ACT6 overlaps with the control line EM, and the seventh channel area ACT73 may be an area where the seventh active layer ACT7 overlaps with the reset line.

In some embodiments, referring to FIG. 3, the first active layer ACT1, the second active layer ACT2, the third active layer ACT3, the fourth active layer ACT4, the fifth active layer ACT5, the sixth active layer ACT6 and the seventh active layer ACT7 may be located in a same layer.

The driving method of the sub-pixel according to some embodiments of the present disclosure will be introduced below. It should be noted that, in the following description, assume that the sub-pixel comprises transistors T1, T2, T3, T4, T5, T6 and T7, and the transistors T1, T2, T3, T4, T5, T6 and T7 are all P-type transistors.

In a reset phase, the third transistor T3 is turned on in response to the reset signal of the reset line Reset, and the second gate G2 of the second transistor T2 is connected to the initialization line Vinit through the third transistor T3. As such, the voltage of the second gate G2 of the second transistor T2 is reset to the voltage of the initialization line Vinit.

In a compensation phase, the first transistor T1 and the fourth transistor T4 are turned on in response to the scan signal of the gate line Gate. In this case, the second transistor T2 is in a diode connected state, and forwardly biased. The voltage of the second gate G2 of the second transistor T2 is a sum of the voltage Vdata of the data signal from the data line Data and the threshold voltage Vth (negative number) of the second transistor T2, i.e., Vdata+Vth. At this time, the voltage of the first electrode plate C1 of the capacitor C is Vdata+Vth, and the voltage of the second electrode plate C2 of the capacitor C is the voltage ELVDD of the power line VDD. The capacitor C is charged with charges corresponding to a voltage difference between the first electrode plate C1 and the second electrode plate C2.

In the light-emitting phase, the fifth transistor T5 and the sixth transistor T6 are turned on in response to the control signal of the control line EM. The driving current Id is generated in response to a voltage difference between the voltage of the second gate G2 of the second transistor T2 and the voltage of the power line VDD, and the driving current Id is supplied to the light-emitting element D through the sixth transistor T6. In the light-emitting phase, the gate-source voltage Vgs of the second transistor T2 is maintained to be (Vdata+Vth)−ELVDD. The driving current Id is proportional to $(Vdata-ELVDD)^2$. Therefore, the driving current Id is independent of the threshold voltage Vth of the first transistor T1.

In addition, in the reset phase, the seventh transistor T7 is turned on in response to the reset signal of the reset line Reset. In addition, the seventh transistor T7 may be turned on simultaneously with the first transistor T1 and the fourth transistor T4. In order to avoid that the driving current Id drives the light-emitting element D to emit light in a case where the second transistor T2 is turned off, a part of the driving current Id may flow out through the seventh transistor T7 as the bypass current Ibp.

The embodiments of the present disclosure further provide a display device, which may comprise the display panel according to any one of the above embodiments. In an embodiment, the display device may be any product or member with a display function, for example, a mobile terminal, a television, a monitor, a notebook computer, a digital photo frame, a navigator, electronic paper, or the like.

The embodiments of the present disclosure also provide a manufacturing method of a display panel. The manufacturing method of a display panel comprises providing a substrate; and forming a plurality of sub-pixels on the substrate. The structure of at least one sub-pixel comprises a light-emitting element, a first transistor, a capacitor, a second transistor, and a third transistor.

The light-emitting element comprises an anode and a cathode.

The first transistor comprises a first active layer and a first gate connected to a gate line. The first active layer comprises a first electrode area, a second electrode area, and a first channel area located between the first electrode area and the second electrode area. The first electrode area is connected to a data line, and the second electrode area is connected to a power line.

The capacitor comprises a first electrode plate and a second electrode plate connected to the power line.

The second transistor comprises a second active layer and a second gate connected to the first electrode plate. The second active layer comprises a third electrode area, a fourth electrode area, and a second channel area located between the third electrode area and the fourth electrode area. The third electrode area is connected to the second electrode area, and the fourth electrode area is connected to the anode.

The third transistor comprises a third active layer and a third gate connected to a reset line. The third active layer comprises a fifth electrode area, a sixth electrode area, and a third channel area located between the fifth electrode area and the sixth electrode area. The fifth electrode area is connected to the first electrode plate, and the sixth electrode area is directly connected to the initialization line through a via hole.

The orthographic projection of the initialization line on the base substrate is located between the orthographic projection of the reset line on the base substrate and the orthographic projection of the gate line on the base substrate.

For example, before the initialization line is formed, the via hole connected to the sixth electrode area is formed using a mask. For example, the via hole may penetrate through a plurality of insulating layers, as described above.

In the above embodiments, the initialization line is located between the reset line and the gate line, and the sixth electrode area of the third transistor is directly connected to the initialization line through the via hole. In such a display panel, the sixth electrode area is connected to the initialization line without an additional connecting member, thereby reducing the parasitic capacitance caused by the additional connecting member and improving the display effect of the display panel.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising: a base substrate and a plurality of sub-pixels located on the base substrate, at least one sub-pixel of the plurality of sub-pixels comprising:

a light-emitting element, comprising an anode and a cathode;

a first transistor comprising a first active layer and a first gate which is connected to a gate line, wherein the first active layer comprises a first electrode area, a second electrode area, and a first channel area located between the first electrode area and the second electrode area, the first electrode area is connected to a data line, and the second electrode area is connected to a power line;

a capacitor comprising a first electrode plate and a second electrode plate connected to the power line;

a second transistor comprising a second active layer and a second gate which is connected to the first electrode plate, wherein the second active layer comprises a third electrode area, a fourth electrode area, and a second channel area located between the third electrode area and the fourth electrode area, the third electrode area is connected to the second electrode area, and the fourth electrode area is connected to the anode; and a third transistor comprising a third active layer and a third gate which is connected to a reset line, wherein the third active layer comprises a fifth electrode area, a sixth electrode area, and a third channel area located between the fifth electrode area and the sixth electrode area, the fifth electrode area is connected to the first electrode plate, and the sixth electrode area is directly connected to an initialization line through a via hole, wherein an orthographic projection of the initialization line on the base substrate is located between an orthographic projection of the reset line on the base substrate and an orthographic projection of the gate line on the base substrate, and wherein an orthographic projection of the via hole on the base substrate is located within an orthographic projection of the sixth electrode area on the base substrate.

2. The display panel according to claim 1, wherein the orthographic projection of the via hole on the base substrate is located within the orthographic projection of the initialization line on the base substrate.

3. The display panel according to claim 1, wherein:

the fifth electrode area comprises a first portion, a second portion, and a third portion connected between the first portion and the second portion;

the third active layer further comprises another sixth electrode area, and another third channel area located between the second portion and the another sixth electrode area; and the third gate comprises two gates, wherein one of the two gates is located between the first portion and the sixth electrode area, and the other of the two gates is located between the second portion and the another sixth electrode area.

4. The display panel according to claim 3, wherein the sixth electrode area comprises:

a fourth portion; and a fifth portion connected to the fourth portion, located on one side of the fourth portion away from the third channel area, and located on one side of the fourth portion away from the another sixth electrode area, wherein:

the orthographic projection of the via hole on the base substrate is located within an orthographic projection of the fifth portion on the base substrate, and the orthographic projection of the fifth portion on the base substrate is located within the orthographic projection of the initialization line on the base substrate.

5. The display panel according to claim 4, wherein an extending direction of the fifth portion is perpendicular to an extending direction of the fourth portion.

6. The display panel according to claim 4, wherein an orthographic projection of an end of the fifth portion away from the fourth portion on the base substrate has a radian.

7. The display panel according to claim 3, wherein an orthographic projection of the third portion on the base substrate is located within an orthographic projection of the power line on the base substrate.

8. The display panel according to claim 1, wherein the at least one sub-pixel further comprises:

a fourth transistor comprising a fourth active layer and a fourth gate which is connected to the gate line, wherein the fourth active layer comprises a seventh electrode area, an eighth electrode area, and a fourth channel area located between the seventh electrode area and the eighth electrode area, the seventh electrode area is connected to the second gate, and the eighth electrode area is connected to the fourth electrode area.

9. The display panel according to claim 8, wherein the at least one sub-pixel further comprises:

a fifth transistor comprising a fifth active layer and a fifth gate which is connected to a control line, wherein the fifth active layer comprises a ninth electrode area, a tenth electrode area, and a fifth channel area located between the ninth electrode area and the tenth electrode area, the ninth electrode area is connected to the power line, and the tenth electrode area is connected to the second electrode area; and a sixth transistor comprising a sixth active layer and a sixth gate which is connected to the control line, wherein the sixth active layer comprises an eleventh electrode area, a twelfth electrode area, and a sixth channel area located between the eleventh electrode area and the twelfth electrode area, the eleventh electrode area is connected to the fourth electrode area, and the twelfth electrode area is connected to the anode.

10. The display panel according to claim 9, wherein the at least one sub-pixel further comprises:

a seventh transistor comprising a seventh active layer and a seventh gate which is connected to another reset line, wherein the seventh active layer comprises a thirteenth electrode area, a fourteenth electrode area, and a seventh channel area located between the thirteenth electrode area and the fourteenth electrode area, the thirteenth electrode area is connected to the twelfth electrode area, and the fourteenth electrode area is connected to another initialization line.

11. The display panel according to claim 10, wherein:
each of the plurality of sub-pixels comprises the first transistor, the second transistor, the third transistor, the fourth transistor, the fifth transistor, the sixth transistor, and the seventh transistor.

12. The display panel according to claim 10, wherein the first active layer, the second active layer, the third active layer, the fourth active layer, the fifth active layer, the sixth active layer and the seventh active layer are located in a same layer.

13. The display panel according to claim 10, wherein each of the first transistor, the second transistor, the third transistor, the fourth transistor, the fifth transistor, the sixth transistor and the seventh transistor is a P-type transistor.

14. The display panel according to claim 1, wherein the second electrode plate and the initialization line are located in a same layer.

15. The display panel according to claim 1, wherein the gate line, the first electrode plate and the reset line are located in a same layer.

16. The display panel according to claim 1, wherein the data line and the power line are located in a same layer.

17. The display panel according to claim 1, wherein:
the gate line and the first gate are integrally provided;
the first electrode plate and the second gate are integrally provided; and
the reset line and the third gate are integrally provided.

18. A display device, comprising the display panel according to claim 1.

19. A manufacturing method of a display panel, comprising: providing a base substrate and forming a plurality of sub-pixels on the base substrate, at least one sub-pixel of the plurality of sub-pixels comprising:
a light-emitting element, comprising an anode and a cathode;
a first transistor comprising a first active layer and a first gate which is connected to a gate line, wherein the first active layer comprises a first electrode area, a second electrode area, and a first channel area located between the first electrode area and the second electrode area, the first electrode area is connected to a data line, and the second electrode area is connected to a power line;
a capacitor comprising a first electrode plate and a second electrode plate connected to the power line;
a second transistor comprising a second active layer and a second gate which is connected to the first electrode plate, wherein the second active layer comprises a third electrode area, a fourth electrode area, and a second channel area located between the third electrode area and the fourth electrode area, the third electrode area is connected to the second electrode area, and the fourth electrode area is connected to the anode; and
a third transistor comprising a third active layer and a third gate which is connected to a reset line, wherein the third active layer comprises a fifth electrode area, a sixth electrode area, and a third channel area located between the fifth electrode area and the sixth electrode area, the fifth electrode area is connected to the first electrode plate, and the sixth electrode area is directly connected to an initialization line through a via hole,
wherein an orthographic projection of the initialization line on the base substrate is located between an orthographic projection of the reset line on the base substrate and an orthographic projection of the gate line on the base substrate, and
wherein an orthographic projection of the via hole on the base substrate is located within an orthographic projection of the sixth electrode area on the base substrate.

20. A display panel, comprising: a base substrate and a plurality of sub-pixels located on the base substrate, at least one sub-pixel of the plurality of sub-pixels comprising:
a light-emitting element, comprising an anode and a cathode;
a first transistor comprising a first active layer and a first gate which is connected to a gate line, wherein the first active layer comprises a first electrode area, a second electrode area, and a first channel area located between the first electrode area and the second electrode area, the first electrode area is connected to a data line, and the second electrode area is connected to a power line;
a capacitor comprising a first electrode plate and a second electrode plate connected to the power line;
a second transistor comprising a second active layer and a second gate which is connected to the first electrode plate, wherein the second active layer comprises a third electrode area, a fourth electrode area, and a second channel area located between the third electrode area and the fourth electrode area, the third electrode area is connected to the second electrode area, and the fourth electrode area is connected to the anode;
a third transistor comprising a third active layer and a third gate which is connected to a reset line, wherein the third active layer comprises a fifth electrode area, a sixth electrode area, and a third channel area located between the fifth electrode area and the sixth electrode area, the fifth electrode area is connected to the first electrode plate, and the sixth electrode area is directly connected to an initialization line through a via hole, and
a fourth transistor comprising a fourth active layer and a fourth gate which is connected to the gate line, wherein the fourth active layer comprises a seventh electrode area, an eighth electrode area, and a fourth channel area located between the seventh electrode area and the eighth electrode area, the seventh electrode area is connected to the second gate, and the eighth electrode area is connected to the fourth electrode area,
wherein an orthographic projection of the initialization line on the base substrate is located between an orthographic projection of the reset line on the base substrate and an orthographic projection of the gate line on the base substrate.

* * * * *